(12) United States Patent
Yang

(10) Patent No.: US 11,930,672 B2
(45) Date of Patent: Mar. 12, 2024

(54) DISPLAY DEVICE

(71) Applicant: LG DISPLAY CO., LTD., Seoul (KR)

(72) Inventor: Yeong-Yun Yang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/130,681

(22) Filed: Dec. 22, 2020

(65) Prior Publication Data

US 2021/0202663 A1 Jul. 1, 2021

(30) Foreign Application Priority Data

Dec. 31, 2019 (KR) .................. 10-2019-0178919

(51) Int. Cl.
| | |
|---|---|
| *H01L 27/32* | (2006.01) |
| *G02F 1/13* | (2006.01) |
| *G02F 1/1345* | (2006.01) |
| *G02F 1/1362* | (2006.01) |
| *G09G 3/00* | (2006.01) |
| *H10K 59/121* | (2023.01) |
| *H10K 59/131* | (2023.01) |
| *G09G 3/3225* | (2016.01) |
| *G09G 3/3275* | (2016.01) |
| *H01L 21/70* | (2006.01) |

(52) U.S. Cl.
CPC ........... *H10K 59/131* (2023.02); *G09G 3/006* (2013.01); *H10K 59/1213* (2023.02); *G02F 1/1309* (2013.01); *G02F 1/13458* (2013.01); *G02F 1/136254* (2021.01); *G09G 3/3225* (2013.01); *G09G 3/3275* (2013.01); *G09G 2300/0426* (2013.01); *G09G 2330/12* (2013.01)

(58) Field of Classification Search
CPC ............ H01L 27/3276; H01L 27/3262; H01L 51/5203; H01L 21/707; G09G 3/006; G09G 2300/0426; G09G 3/3275; G09G 3/3233; G09G 3/3225; G09G 2330/12; H10K 59/131; H10K 59/1213; H10K 50/805; G02F 1/1309; G02F 1/13458; G02F 1/136254
See application file for complete search history.

(56) References Cited

U.S. PATENT DOCUMENTS

| | | | |
|---|---|---|---|
| 6,853,364 B2 | 2/2005 | Kai et al. | |
| 2006/0274570 A1* | 12/2006 | Jeoung | G09G 3/3685 365/154 |
| 2018/0315366 A1* | 11/2018 | Jia | G09G 3/2007 |

(Continued)

FOREIGN PATENT DOCUMENTS

| | | | |
|---|---|---|---|
| KR | 10-2002-0077033 A | | 10/2002 |
| KR | 20100071862 A | * | 12/2008 |
| KR | 2010-0071862 | * | 6/2010 |

*Primary Examiner* — Douglas M Wilson
(74) *Attorney, Agent, or Firm* — Morgan, Lewis & Bockius LLP

(57) ABSTRACT

A display device includes a substrate including a display area and a non-display area, the display area including pixels; data lines extending into the display area and connected to pixels; a first input pad in the non-display area and connected to the data lines; a switching transistor located in the non-display area between the first input pad and one side of the substrate and connected to the first input pad; and a second input pad in the non-display area and connected to a gate electrode of the switching transistor through a switching line.

15 Claims, 6 Drawing Sheets

(56) References Cited

U.S. PATENT DOCUMENTS

| | | | |
|---|---|---|---|
| 2021/0118344 A1* | 4/2021 | Kim | G09G 3/3266 |
| 2021/0225221 A1* | 7/2021 | Zhang | H01L 27/124 |
| 2021/0335170 A1* | 10/2021 | Lee | H01L 23/3114 |
| 2021/0366328 A1* | 11/2021 | Yu | G02F 1/136286 |

* cited by examiner

DISPLAY DEVICE

CROSS-REFERENCE TO RELATED APPLICATIONS

This application claims the benefit of Korean Patent Application No. 10-2019-0178919, filed on Dec. 31, 2019, in the Korean Intellectual Property Office, which is incorporated herein by reference in its entirety.

BACKGROUND

Technical Field

The present disclosure relates to a display device.

Discussion of the Related Art

As the information society develops, the demands for display devices for displaying images are increasing in various forms. Recently, various flat display devices such as liquid crystal display (LCD) devices, plasma display panel (PDP) display devices, and organic light emitting display (OLED) devices have been used.

Among the flat panel display devices, the OLED devices are receiving a great deal of attention in recent years because they have advantages of miniaturization, weight reduction, thinness, and low power driving.

In manufacturing the OLED device, a trimming process is performed after a display panel is manufactured to remove an outer portion of a trimming line. In addition, lines extending outward from a pad connected to data lines are also separated through the trimming process.

However, during the trimming process, foreign materials may be generated, and thus the extending lines may be electrically shorted due to the generated foreign materials such that corresponding data lines may be electrically shorted.

As described above, when such a short circuit is generated between the data lines, during driving of the display device (e.g., the OLED device), an abnormal data signal is applied to a pixel through the shorted data line so that an image display defect in which line dim is generated along a pixel column line may be caused.

Meanwhile, the above problem may also occur in other types of display devices having a structure similar to the above described structure.

SUMMARY

The embodiments of present disclosure are directed to a display device that substantially obviates one or more of the problems associated with the limitations and disadvantages of the related conventional art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including a display area and a non-display area, the display area including pixels; data lines extending into the display area and connected to pixels; a first input pad in the non-display area and connected to the data lines; a switching transistor located in the non-display area between the first input pad and one side of the substrate and connected to the first input pad; and a second input pad in the non-display area and connected to a gate electrode of the switching transistor through a switching line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Figure 1:
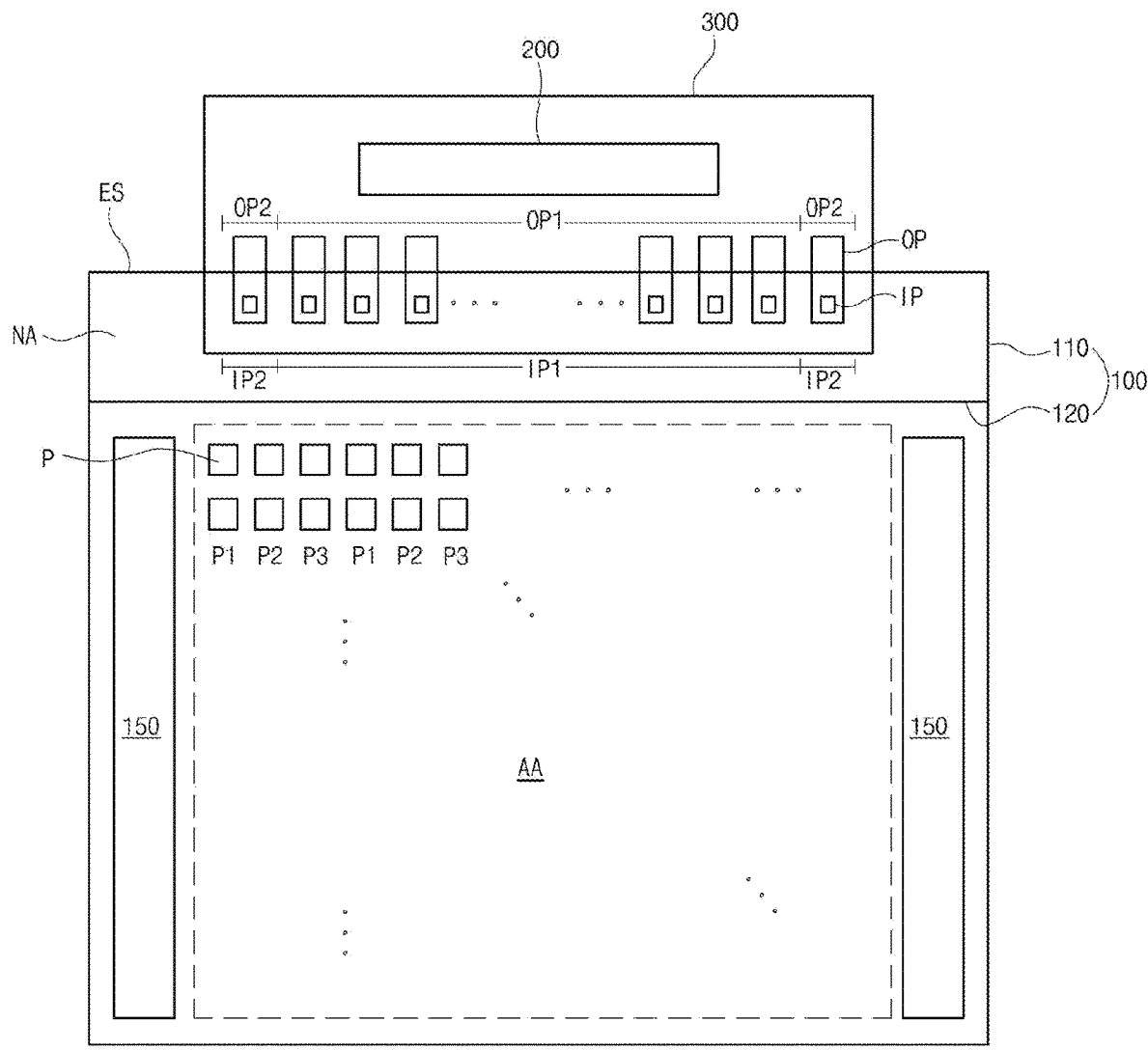
FIG. 1 is a schematic diagram illustrating an organic light emitting display (OLED) device according to an embodiment of the present disclosure.

Advantages and features of the present disclosure and methods for achieving them will be made clear from embodiments described in detail below with reference to the accompanying drawings. The present disclosure may, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains, and the present disclosure is defined by only the scope of the appended claims.

Shapes, sizes, ratios, angles, numbers, and the like disclosed in the drawings for describing the embodiments of the present disclosure are illustrative, and thus the present disclosure is not limited to the illustrated matters. The same reference numerals refer to the same components throughout this disclosure. Further, in the following description of the present disclosure, when a detailed description of a known related art is determined to unnecessarily obscure the gist of the present disclosure, the detailed description thereof will be omitted herein. When terms such as "including", "having", "consisting of", and the like mentioned in this disclosure are used, other parts may be added unless the term "only" is used herein. When a component is expressed as being singular, being plural is included unless otherwise specified.

In analyzing a component, an error range is interpreted as being included even when there is no explicit description.

In describing a positional relationship, for example, when a positional relationship of two parts is described as being "on", "above", "below", "next to", or the like, unless "immediately" or "directly" is used, one or more other parts may be located between the two parts.

In describing a temporal relationship, for example, when a temporal predecessor relationship is described as being "after", "subsequent", "next to", "prior to", or the like, unless "immediately" or "directly" is used, cases that are not continuous may also be included.

Although the terms first, second, and the like are used to describe various components, these components are not substantially limited by these terms. These terms are used only to distinguish one component from another component. Therefore, a first component described below may substantially be a second component within the technical spirit of the present disclosure.

In describing components of this disclosure, the terms first, second, A, B, (a), (b), and the like can be used. These terms are intended to distinguish one component from other components, but the nature, sequence, order, or number of the components is not limited by those terms. When components are disclosed as "connected", "coupled", or "in contact" with other components, the components can be directly connected or in contact with the other components, but it should be understood that another component(s) could be "interposed" between the components and the other components or could be "connected", "coupled", or "contacted" therebetween.

In the specification, a "display device" may include display devices in a narrow sense, such as liquid crystal modules (LCMs), organic light emitting display (OLED) modules, and quantum dot (QD) modules, and the like which include display panels and drivers for driving the display panels. In addition, the display device may also include laptop computers, televisions, and computer monitors which are complete products or final products including LCMs, OLED modules, QD modules, or the like, equipment displays including automotive displays or other types of vehicles, and set electronic devices, set devices, or set apparatuses such as mobile electronic devices such as smartphones or electronic pads.

Thus, the display device in the specification may include display devices in a narrow sense, such as LCMs, OLED modules, QD modules, or the like, and application products or set devices which are end consumer devices, which include the LCMs, the OLED modules, the QD modules, or the like.

In addition, in some cases, it may be separately expressed that LCMs, OLED modules, and QD modules, which include display panels and drivers, are expressed as "display devices" in some cases, and electronic devices as complete products including the LCMs, the OLED modules, or QD modules are expressed as "set devices". For example, the display device in a narrow sense may be a concept including a display panel such as a liquid crystal display (LCD) panel, an OLED panel, or a QD display panel, and a source printed circuit board (PCB) which is a controller for driving the display panel, and the set device may be a concept further including a set PCB which is a set controller which is electrically connected to the source PCB to control an entirety of the set device.

The display panel used in the present embodiment may employ all types of display panels such as a liquid crystal display panel, an OLED panel, a QD display panel, an electroluminescent display panel, and the like. However, the present disclosure is not limited to a specific display panel of which a bezel may be bent with a flexible substrate for an OLED panel of the present embodiment and a backplane support structure below the flexible substrate. In addition, the display panel used in the display device according to an embodiment of the specification is not limited to a shape or size of the display panel.

For example, when the display panel is an OLED panel, the display panel may include a plurality of gate lines, a plurality of data lines, and a plurality of pixels formed in intersection regions between the gate lines and the data lines. In addition, each of the pixels may include an array including a thin film transistor (TFT) which is an element for selectively applying a voltage to each pixel, an OLED layer on the array, and an encapsulation substrate or an encapsulation layer, which is disposed on the array to cover the OLED layer. The encapsulation layer may protect the TFT and the OLED layer from an external impact and prevent moisture or oxygen from infiltrating into the OLED layer. In addition, a layer formed on the array may include an inorganic light emitting layer, e.g., a nano-sized material layer or a quantum dot.

FIG. 1 is a schematic diagram illustrating an OLED device according to an embodiment of the present disclosure. For convenience of description, FIG. 1 illustrates a schematic configuration of an OLED device 10 in a state of a modularized product.

Referring to FIG. 1, the OLED device 10 according to an embodiment of the present disclosure may be a display device employing a chip-on-film (COF) type drive integrated circuit (IC) 200.

The OLED device 10 may include a display panel 100 which is an organic light emitting panel displaying an image, and at least one circuit film 300 on which the drive IC 200 is mounted on an upper surface thereof and which is connected to an edge of one side of the display panel 100.

In the present embodiment, for convenience of description, an example in which one circuit film 300 is employed will be described.

The display panel 100 may include an array substrate 110 (or a thin-film-transistor (TFT) substrate) which is a first substrate and a counter substrate 120 which is a second substrate facing the array substrate 110, wherein the array substrate 110 and the counter substrate 120 face each other and are bonded to each other. The array substrate 110 may be a flexible substrate, and the counter substrate 120 may be a cover glass or a cover substrate.

A display area AA for displaying an image and a non-display area NA which is located at an outer side of the display area AA and surrounds the display area AA are defined in the display panel 100.

For example, a non-display area NA of an upper edge, which is the non-display area NA of the array substrate 110 not covered with the counter substrate 120 and exposed, may be connected to the circuit film 300 to receive a panel drive signal.

In the array substrate 110 of the display panel 100, a plurality of pixels P are disposed in the display area AA in the form of a matrix in a row direction (or a horizontal direction or first direction) and a column direction (or a vertical direction or second direction). In addition, an array element, which is a drive element for driving each pixel P, may be formed in each pixel P.

Meanwhile, pixels P may be disposed to be located on each column line to emit the same color light, and pixels P may be disposed to be located on each row line to emit different color lights. In this regard, for example, first to third pixels P1 to P3 emitting red light R, green light G, and blue light B may be alternately disposed along each row line, and pixels P emitting the same color light may be disposed on the same column line. However, the present disclosure is not necessarily limited thereto, and pixels P emitting red light R, green light G, and blue light B may be alternately disposed on the column lines, and pixels P emitting the same color light may be disposed on the same row line.

Referring to FIG. 1, a plurality of input pads IP receiving panel drive signals output from the drive IC 200 to drive the display panel 100 may be formed in the non-display area NA of the array substrate 110.

In the non-display area NA in which the input pads IP are formed, the circuit film 300 on which the drive IC 200 is mounted is bonded to the display panel 100 to be modularized. Thus, a plurality of output pads OP formed on a lower surface of the circuit film 300 may be connected to corresponding input pads IP.

Here, a connection medium member such as an anisotropic conductive film (ACF) is disposed between the circuit film 300 and the display panel 100 so that the output pads OP and the input pads IP may be connected.

As described above, since the output pads OP and the input pads IP corresponding to each other are connected, signals output from the output pads OP may be applied to the input pads IP. The signals applied to the input pads IP may be transmitted to an inside of the array substrate 110 through lines formed in the array substrate 110 and connected to the input pads IP.

Meanwhile, in the non-display area NA of the array substrate 110, a scan drive circuit 150 for driving gate lines and light emission lines may be formed in a gate-in panel (GIP) manner. The scan drive circuit 150 formed in the GIP manner may be directly formed in the non-display area NA in a process of forming drive elements of the pixels P. Meanwhile, in terms of stably driving the display panel 100, the scan drive circuit 150 formed in the GIP manner may be formed on both sides facing each other, e.g., on a left edge and a right edge of the display area AA, by interposing the display area AA therebetween.

As another example, the scan drive circuit 150 may be formed as an IC and mounted on the array substrate 110 in a chip-on-glass (COG) manner or may be connected to the array substrate 110 in a COF manner. Alternatively, the scan drive circuit 150 may be formed in a form of being integrated in the drive IC 200.

Meanwhile, for example, the plurality of input pads IP formed in the array substrate 110 may include a plurality of first input pads IP1 for receiving data signals (or image signals) as panel drive signals, and at least one second input pad IP2 for receiving a switching signal.

Meanwhile, although not shown in detail, input pads which each receive a drive control signal and a panel driving power voltage signal may be provided in the plurality of input pads IP.

A first input pad IP1 receiving a data signal transmits the data signal to a data line DL which is connected to the first input pad IP1 and extends to the inside of the display area AA.

Meanwhile, a second input pad IP2 receiving a switching signal to output the switching signal corresponds to a pad for supplying the switching signal for switching a switching transistor (not shown), which is disposed between the first input pad IP1 and one side of the array substrate 110 adjacent thereto, for example, disposed in the non-display area NA in an upper side ES, and is connected to the first input pad IP1.

For example, the second input pad IP2 may be disposed in a second area outside a first area in which the plurality of first input pads IP1 are disposed, but the present disclosure is not limited thereto. Meanwhile, in order to stably supply the switching signal, two second input pads IP2 may be disposed at both sides of the first area in which the plurality of first input pads IP1 are disposed.

When the input pads IP are formed as described above, a plurality of output pads OP of the circuit film 300 corresponding to the input pads IP and connected thereto may also be formed in the similar manner. In this regard, the plurality of output pads OP may include a plurality of first output pads OP1 for outputting data signals and at least one second output pad OP2 for outputting a switching signal.

Figure 2:
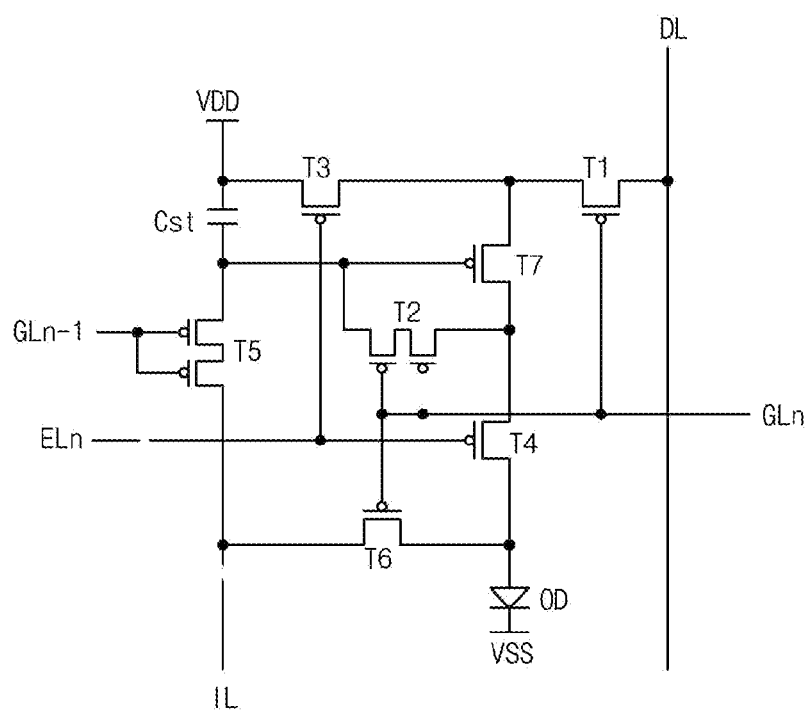
FIG. 2 is a schematic circuit diagram illustrating an example of a structure of a pixel in the OLED device according to the embodiment of the present disclosure.

A structure of a pixel of the display panel 100 will be described with reference to FIG. 2. FIG. 2 is a schematic circuit diagram illustrating an example of a structure of a pixel in the OLED device according to an embodiment of the present disclosure.

An array device including a plurality of transistors T1 to T7, a light emitting diode OD, and a storage capacitor Cst may be formed in each pixel P.

Meanwhile, in the present embodiment, an example of a 7T1C structure in which seven transistors T1 to T7 and one capacitor Cst are provided in each pixel P will be described, but the present disclosure is not limited thereto, and structures different from the 7T1C structure may be applied. Meanwhile, in the seven transistors T1 to T7 of the 7T1C structure, the first to sixth transistors T1 to T6 may correspond to switching transistors performing on/off switching functions, and the seventh transistor T7 may correspond to a drive transistor for controlling a light emission current applied to the light emitting diode OD.

In describing a connection structure of the elements in the 7T1C structure, a gate electrode of the first transistor T1 may be connected to a row line at which a corresponding pixel P is located, for example, connected to a gate line GLn of an nth row line, and a source electrode of the first transistor T1 may be connected to a data line DL. In addition, a drain electrode of the first transistor T1 may be connected to a node between a source electrode of the third transistor T3 and a source electrode of the seventh transistor T7.

A gate electrode of the second transistor T2 may be connected to the gate line GLn of the corresponding $n^{th}$ row line, a source electrode thereof may be connected to a node between a drain electrode of the seventh transistor T7 and a source electrode of the fourth transistor T4, and a drain electrode thereof may be connected to a gate line of the seventh transistor T7.

A gate electrode of the third transistor T3 may be connected to an emission line ELn of the corresponding $n^{th}$ row line, and a drain electrode thereof may be connected to a first electrode of the storage capacitor Cst to receive a high potential drive voltage VDD (or a first drive voltage).

A gate electrode of the fourth transistor T4 may be connected to the emission line ELn of the corresponding $n^{th}$ row line, and a drain electrode thereof may be connected to a node between a first electrode (or anode) of the light emitting diode OD and a drain electrode of the sixth transistor T6.

A gate electrode of the fifth transistor T5 may be connected to a gate line GLn-1 of a $(n-1)^{th}$ row line that is a previous row line, a source electrode thereof may be connected to a second electrode of the storage capacitor Cst, and a drain electrode thereof may be connected to an initialization line IL for supplying an initialization voltage and a source electrode of the sixth transistor T6.

A gate electrode of the sixth transistor T6 may be connected to the gate line GLn of the corresponding $n^{th}$ row line.

The gate electrode of the seventh transistor T7 may be connected to a node between a drain electrode of the second transistor T2 and the second electrode of the storage capacitor Cst.

The first electrode of the light emitting diode OD may be connected to a node between the fourth transistor T4 and the sixth transistor T6, and the second electrode (or cathode) thereof may receive a low potential drive voltage (or a second drive voltage).

As described above, in the array substrate 110 of the present embodiment, the switching transistors which are switched in response to the switching signals of the second input pads IP2 are formed in an upper area of the first input pads IP1. According to the above structure, an electrically insulating state, that is, a disconnection state, may be set between the first input pads IP1 and the upper area thereof due to switching operations of the switching transistors located therebetween.

Thus, as a trimming process of removing an edge of the display panel 100 is performed after the display panel 100 is manufactured, foreign materials are generated in the upper side ES corresponding to an upper trimming line of the array substrate 110, and even when an electrical short circuit phenomenon occurs between lines located in an upper area of the switching transistors due to the foreign materials, the switching transistors are each switched to an off state so that the lines in the upper area and the first input pads IP1 corresponding thereto may be in an electrical disconnection state.

Consequently, it is possible to prevent occurrence of a line dim phenomenon in which adjacent data lines are electrically shorted due to the foreign materials.

A structure for preventing the above electrical short circuit between data lines will be described in more detail below.

Figure 3:
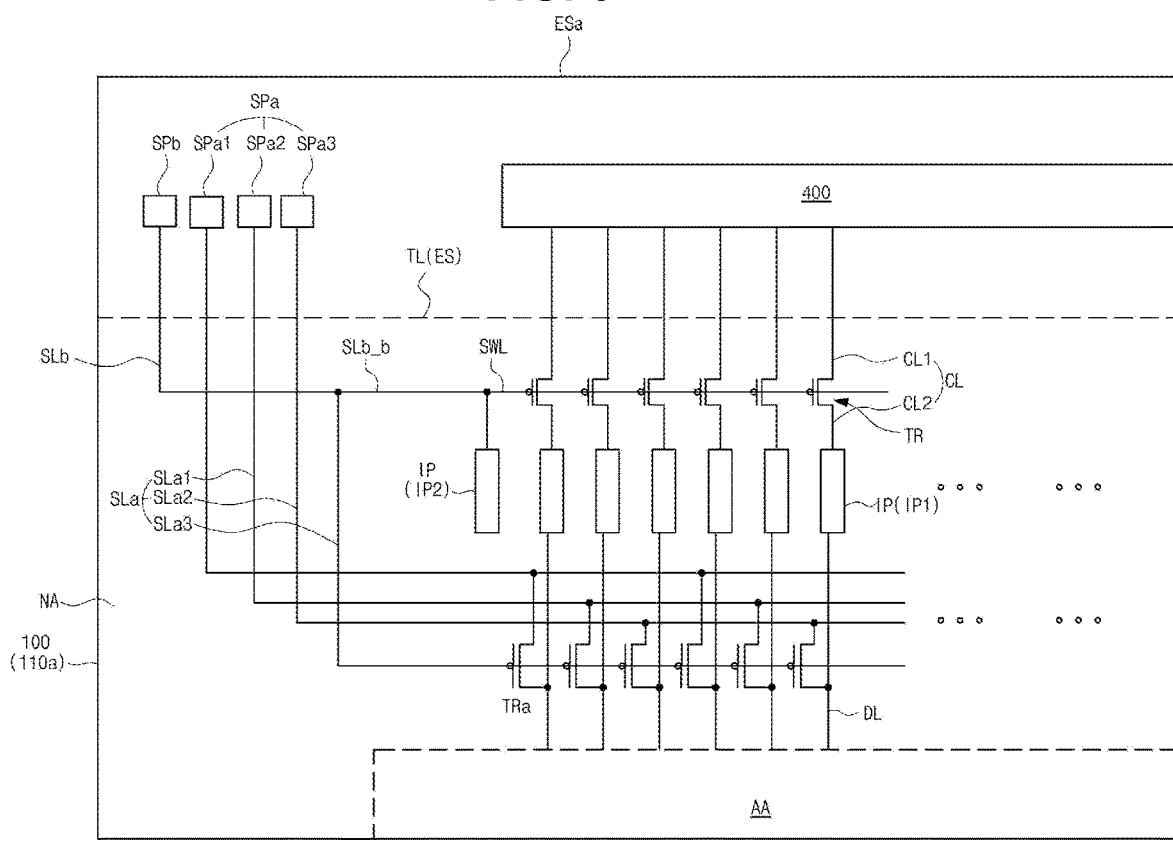
FIG. 3 is a schematic diagram illustrating a structure of an array substrate of a display panel in a state before a trimming process according to an embodiment of the present disclosure.

FIG. 3 is a schematic diagram illustrating a structure of the array substrate of the display panel in a state before a trimming process according to an embodiment of the present disclosure, and for convenience of description, a partial area of the array substrate is shown.

FIG. 3 illustrates a state in which the array substrate of the display panel 100 is manufactured before the trimming process is performed, that is, a state in which an array substrate 110a is in a cell state.

Referring to FIG. 3, the plurality of input pads IP may be disposed in an upper edge area of the non-display area NA, which is the non-display area NA of the array substrate 110a in the cell state and to which the circuit film 300 of FIG. 1 is bonded after the trimming process.

The plurality of input pads IP may include the first input pads IP1 to which data signals are applied and the second input pad IP2 to which a switching signal is applied in a module state of the OLED device 10.

Since the input pads IP are present in the display panel 100 in a state after the trimming process, the input pads IP are located in an area inward of a trimming line TL based on the trimming line TL.

Meanwhile, an electrical characteristic test circuit 400 may be formed in an outer area of the trimming line TL, which is an area adjacent to an upper side ESa of the array substrate 110a in the cell state.

In this regard, in the process of manufacturing the display panel 100, a process of forming the transistors T1 to T7 of FIG. 2 in each pixel is performed and, when the process of forming the transistors is completed, a panel electrical characteristic test for detecting electrical characteristics of transistors in each pixel, that is, a panel electrical system (PES) test, may be performed. Through the panel electrical characteristic test, a defect may be detected before the panel manufacturing is completed.

The electrical characteristic test circuit 400, which is a test circuit for performing the panel electrical characteristic test, may be formed. The electrical characteristic test circuit 400 may be formed in the process of forming the transistors in the display area AA.

The electrical characteristic test circuit 400 is formed in the outer area of the trimming line TL, which is separated and removed during the trimming process, and is not present in the display panel 100 in a final state.

Since the electrical characteristic test circuit 400 needs to be electrically connected to each pixel for an electrical characteristic test process, the electrical characteristic test circuit 400 may be formed to be electrically connected to each data line DL via each first input pad IP1.

To this end, a plurality of connection lines CL may be formed between the electrical characteristic test circuit 400 and the plurality of first input pads IP1 to electrically connect therebetween.

The connection lines CL may be formed to cross the trimming line TL to extend from the electrical characteristic test circuit 400 to the first input pad IP1.

Thus, when the trimming process is performed along the trimming line TL, the connection lines CL are separated, and thus only portions of the connection lines CL located inward of the trimming line TL remain. As described above, after the trimming process, the connection lines CL have a form in which one ends thereof are located in the upper side ES of the array substrate 110 of FIG. 1, which is identically formed along the trimming line TL, and which extend toward the first input pads IP1.

Meanwhile, an auto probe test circuit for performing an auto probe test which is a lighting test may be formed in the non-display area NA inward of the trimming line TL.

In this regard, when the manufacturing of the array substrate 110a in the cell state, which includes the process of forming the light emitting diode OD of FIG. 2, is completed, the auto probe test is performed. Through the auto probe test, a panel defect may be detected before the trimming process.

To this end, the auto probe test circuit may include a test transistor TRa connected to each data line DL in parallel.

Meanwhile, a test signal line SLa connected to a source electrode of the test transistor TRa to apply a test data signal to the test transistor TRa, and a test control line SLb connected to a gate electrode of the test transistor TRa to apply a test switching signal may be formed in the non-display area NA inward of the trimming line TL. The test signal line SLa and the test control line SLb may be formed in a form of intersecting the data line DL to extend in the horizontal direction.

Meanwhile, for example, the test signal line SLa may include a first test signal line to a third test signal line SLa1 to SLa3 which transmit test data signals applied to the first to third pixels P1 to P3 of FIG. 1, which emit red light, green light, and blue light, respectively.

A test signal pad SPa and a test control pad SPb for applying corresponding test signals to the test signal line SLa and the test control line SLb may be provided in the array substrate 110a. The test signal pad SPa may include first to third test signal pads SPa1 to SPa3 connected to the first test signal line to third test signal line SLa1 to SLa3, respectively.

The test signal pad SPa and the test control pad SPb may be disposed in the outer area of the trimming line TL and removed after the trimming process.

Meanwhile, in the present embodiment, a plurality of switching transistors TR which are electrically connected between the electrical characteristic test circuit 400 and the plurality of first input pads IP1 may be provided in the non-display area NA inward of the trimming line TL. That is, the switching transistor TR is connected to a corresponding first input pad IP1 through the connection line CL and may also be connected to the electrical characteristic test circuit 400.

In this regard, each connection line CL electrically connecting each first input pad IP1 to the electrical characteristic test circuit 400 may be formed to be divided into a first line CL1 connected to the electrical characteristic test circuit 400 and a second line CL2 connected to the first input pad IP1. In addition, a corresponding switching transistor TR may be connected between the first line CL1 and the second line CL2 of the connection line CL. That is, a source electrode and a drain electrode of the switching transistor TR may be connected to the first line CL1 and the second line CL2, respectively.

In addition, gate electrodes of the plurality of switching transistors TR may be commonly connected to the second input pad IP2 which applies the switching signal. In this regard, a switching line SWL connected to the second input pad IP2 may be formed to extend in the horizontal direction to be commonly connected to the plurality of switching transistors TR.

In addition, the gate electrodes of the plurality of switching transistors TR may be formed to be connected to the test control pad SPb to receive a switching signal for the auto probe test.

In this regard, for example, a branch line SLb b branching off from the test control line SLb connected to the test control pad SPb may be formed to extend to be connected to the switching line SWL.

Thus, the switching transistors TR are connected to the test control pad SPb to receive the test switching signal.

In this regard, the circuit film 300 of FIG. 1 in the modularized state of the display device is not in a state of being bonded to the array substrate 110a in the cell state, and a switching signal is required for performing switching operations of the switching transistors TR for the electrical characteristic test and the auto probe test.

Thus, the array substrate 110a in the cell state may be formed to be connected to the test control pad SPb so as to switch the switching transistor TR and formed to receive the switching signal of the test control pad SPb.

Before the trimming process, the array substrate 110a in the cell state may perform the above described electrical characteristic test and the above described auto probe test.

In this regard, the electrical characteristic test is performed after the transistors are formed in the display area AA, that is, is performed before the light emitting diode OD of FIG. 2 is formed.

Figure 4:
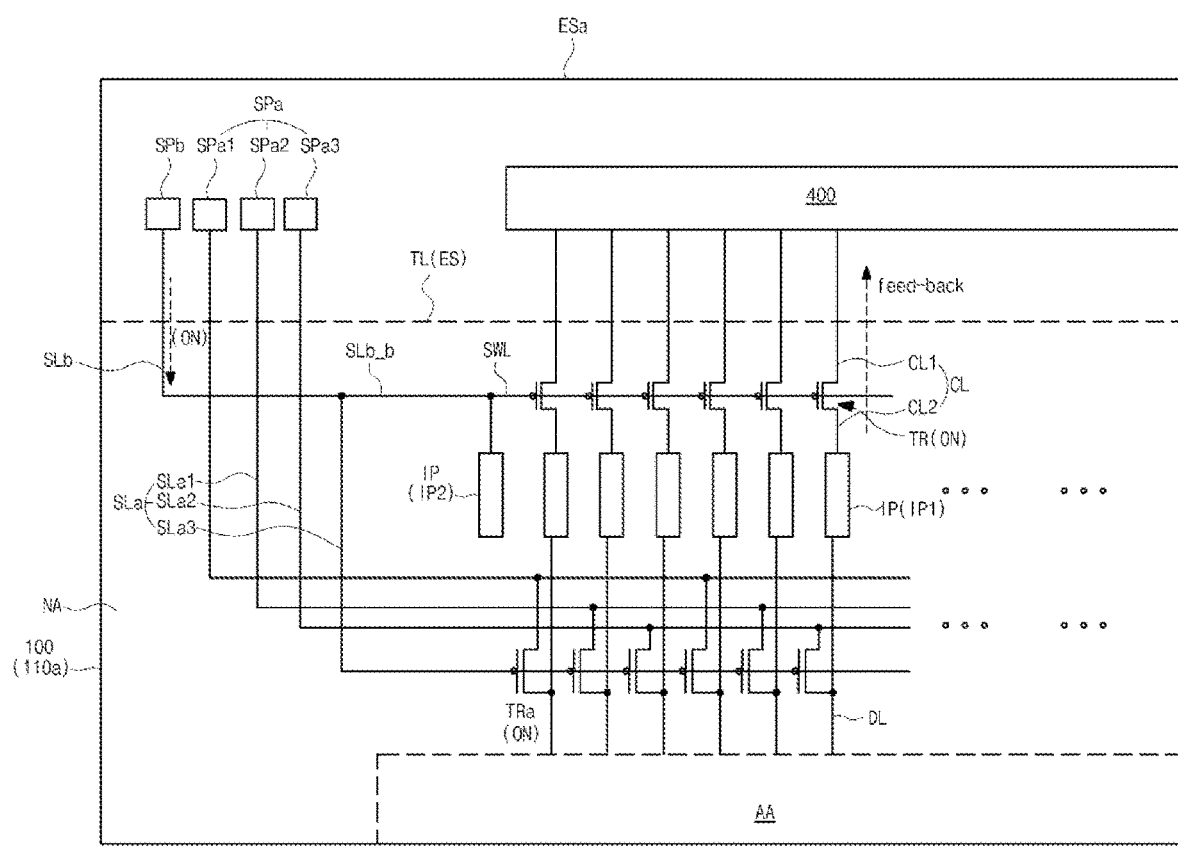
FIG. 4 is a schematic diagram illustrating an electrical characteristic test with respect to the display panel in the state before the trimming process according to an embodiment of the present disclosure.

Referring to FIG. 4, during the electrical characteristic test, the switching transistor TR may be turned on to receive feedback of an electrical characteristic signal from the pixel P through the data line DL. To this end, a test switching signal of a turn-on level is applied to the test control pad SPb to which the gate electrodes of the switching transistors TR are connected, and thus all the switching transistors TR are turned on.

Consequently, the data lines DL and the electrical characteristic test circuit 400 are electrically connected so that an electrical characteristic signal may be transmitted from each pixel P.

Meanwhile, a control signal of a turn-on level is also applied to the test transistor TRa which is electrically connected to the switching transistor TR in parallel, and thus the test transistor TRa is also turned on. However, the test signal pad SPa becomes a floating state in which a signal is not applied so that an actual effect on the electrical characteristic test is not generated.

Next, the auto probe test is substantially performed after the manufacturing of the array substrate 110a.

Figure 5:
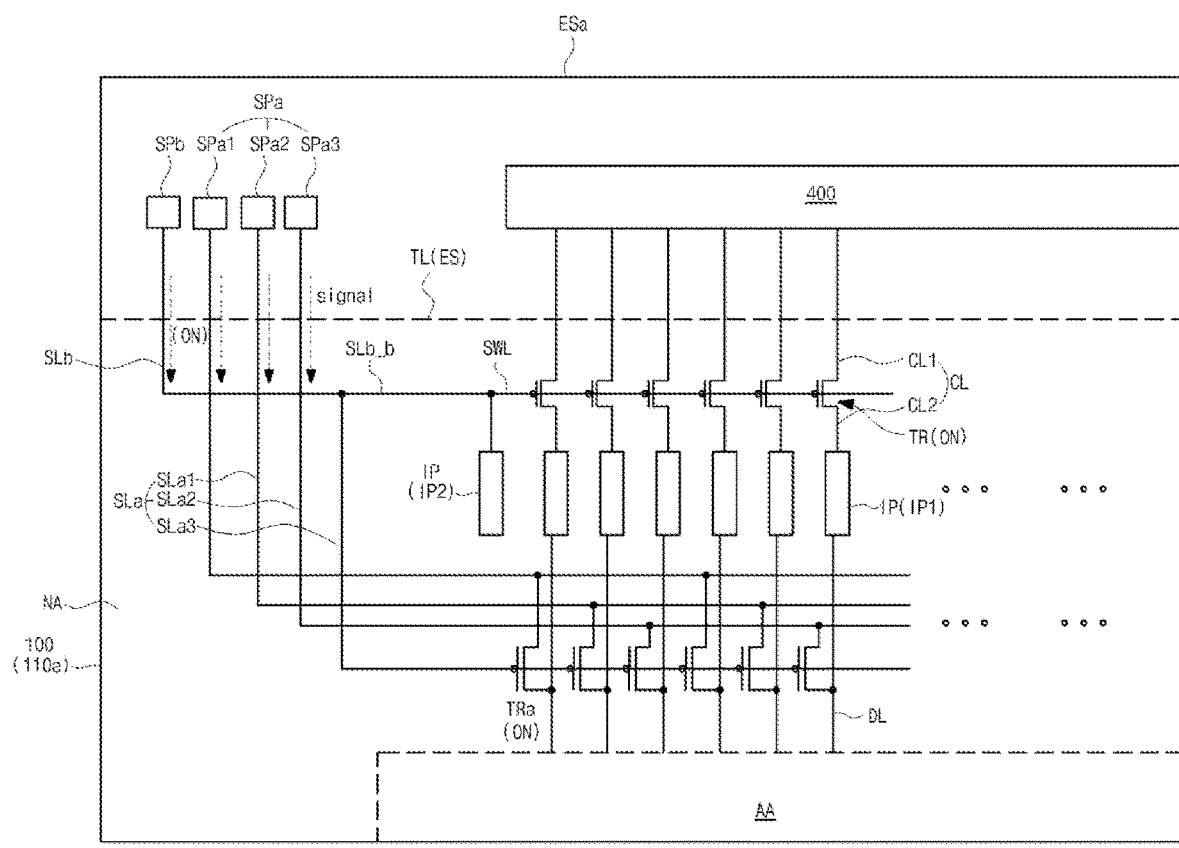
FIG. 5 is a schematic diagram illustrating an auto probe test with respect to the display panel in the state before the trimming process according to an embodiment of the present disclosure.

Referring to FIG. 5, during the auto probe test, the test transistor TRa is turned on to apply the test data signal to each pixel P. To this end, a control signal of a turn-on level is applied to the test control pad SPb, and thus all test transistors TRa are turned on. In the above state, the test data signal is applied to the test signal pad SPa and then applied to each pixel through the data line DL so that each pixel emits light. A lighting test may be performed through the above light emission state of each pixel.

Meanwhile, the control signal of a turn-on level is also applied to the switching transistor TR which is electrically connected to the test transistor TRa in parallel, and thus the switching transistor TR is also turned on. However, since the operation of the electrical characteristic test circuit 400 is in an off state, an actual effect on the auto probe test is not generated.

After the above described auto probe test process, a trimming process is performed on the array substrate 110a to separate and remove the non-display area NA outside the trimming line TL. For example, the trimming process may be performed using a laser.

Thus, the electrical characteristic test circuit 400 for the electrical characteristic test, and the test signal pad SPa and the test control pad SPb for the auto probe test are removed from the display panel 100.

In addition, the connection line CL is separated along the trimming line TL, and thus a portion of the connection line CL outside the trimming line TL is removed, and a portion thereof inward of the trimming line TL remains in the display panel 100.

In addition, the test signal line SLa and test control line SLb are separated along the trimming line TL, and thus portions of the test signal line SLa and test control line SLb outside the trimming line TL are removed, and portions thereof inward of the trimming line TL remain in the display panel 100.

A circuit film on which a drive IC is mounted may be bonded to the display panel 100 to manufacture a modularized OLED device, and in such a modularized state, the OLED device may be driven to display an image.

Figure 6:
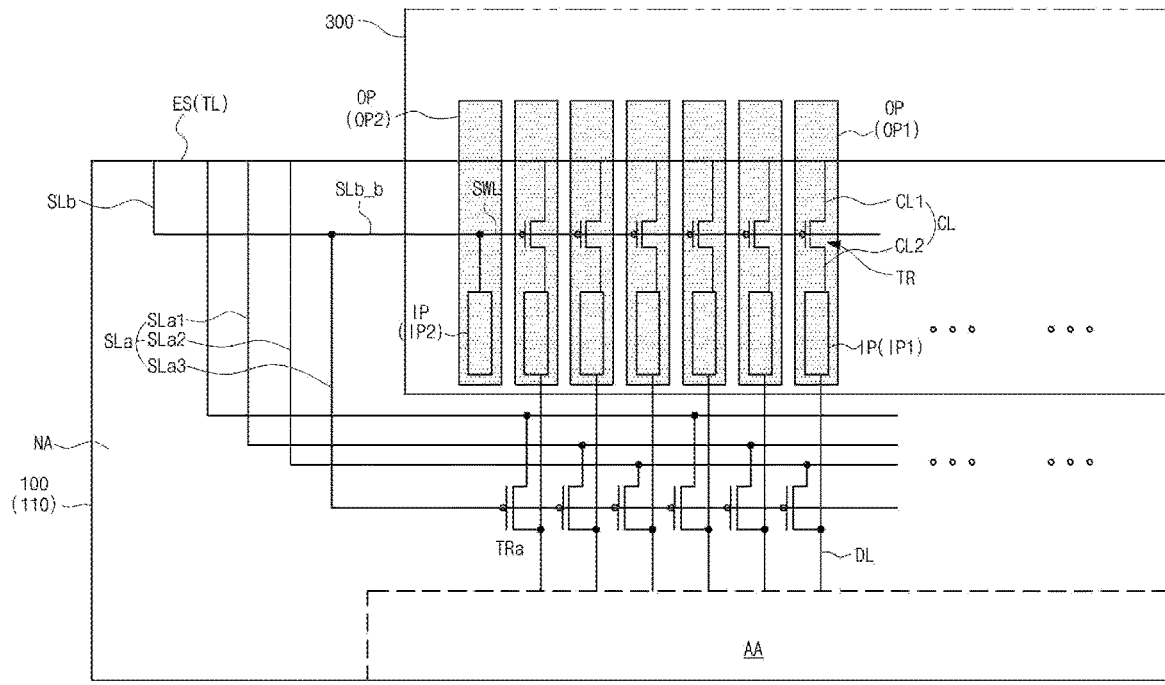
FIG. 6 is a schematic diagram illustrating the display panel and a circuit film bonded thereto after the trimming process according to an embodiment of the present disclosure.

FIG. 6 is a schematic diagram illustrating the display panel and the circuit film bonded thereto after the trimming process according to an embodiment of the present disclosure.

Referring to FIG. 6, the array substrate 110 in a state in which the trimming process is completed has an outer side corresponding to the trimming line TL so that components in the area inward of the trimming line TL remain.

In this regard, the input pads IP, the test transistors TRa, and the switching transistors TR, which are formed inward of the trimming line TL, directly remain in the non-display area NA.

In addition, the connection lines CL formed inward of the trimming line TL remain. One ends of the connection lines CL have a shape coinciding with the upper side ES, and thus the connection lines CL have a shape extending upward to the upper side ES.

Likewise, the test signal lines SLa and the test control line SLb, which are formed inward of the trimming line TL, also remain. One end of each of the test signal lines SLa and test control lines SLb has a shape coinciding with the upper side ES, and thus each of the test signal lines SLa and test control line SLb has a shape extending upward to the upper side ES.

The circuit film 300 may be bonded to the array substrate 110, which is formed as described above, to be modularized.

The plurality of output pads OP are provided in the circuit film 300, and each of the plurality of output pads OP is connected to a corresponding input pad IP formed in the array substrate 110.

The plurality of output pads OP may be formed to extend in a vertical direction perpendicular to a horizontal direction which is an extension direction of the upper side ES of the array substrate 110.

When the circuit film 300 is bonded to the array substrate 110, the first input pad IP1 may be connected to the corresponding first output pad OP1 to receive a data signal for displaying an image.

In addition, the second input pad IP2 may be connected to the corresponding second output pad OP2 to receive a switching signal output from the second output pad OP2.

As described above, when the switching signal is applied to the second input pad IP2, the switching signal is transmitted to the switching transistors TR through the switching line SWL.

Meanwhile, since the switching line SWL and the test control line SLb remain in a connection state, the test control line SLb is in a state of being connected to the second input pad IP2. Thus, the test transistors TRa connected to the test control line SLb may be maintained in a parallel connection state with the switching transistors TR to equally receive the switching signals applied to the switching transistors TR and switched.

Figure 7:
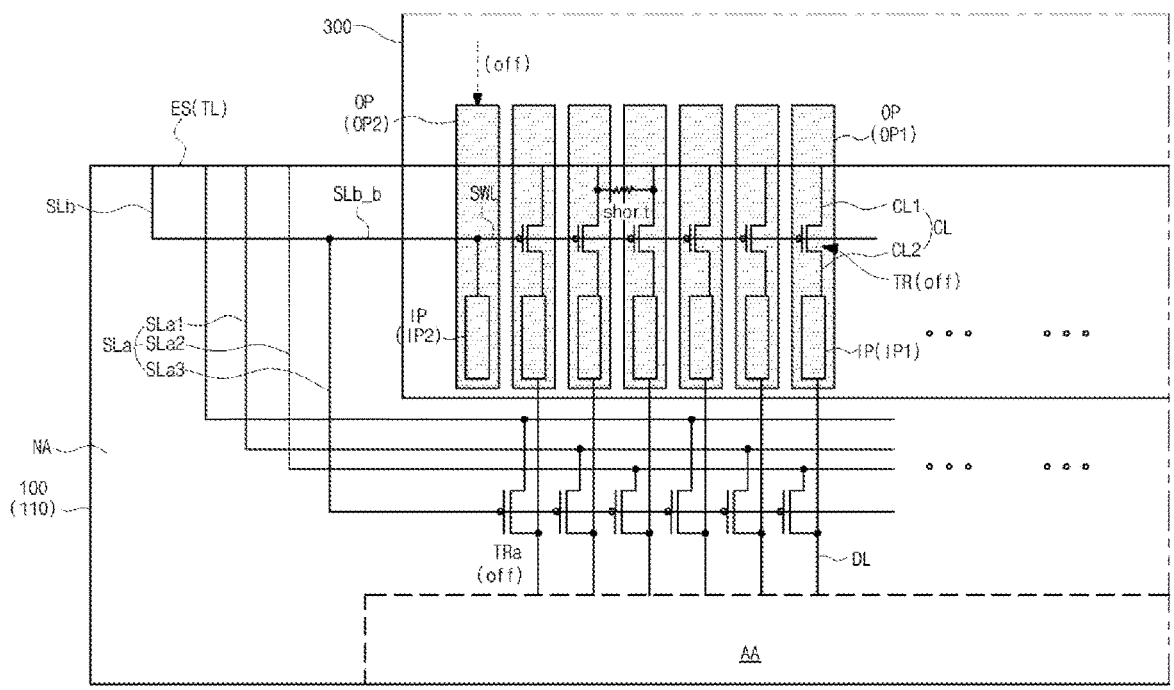
FIG. 7 is a schematic diagram illustrating a drive state of a modularized display panel to which the circuit film is bonded according to an embodiment of the present disclosure.

As described above, as shown in FIG. 7, in a state in which the display panel 100 and the circuit film 300 are modularized, a switching signal of a turn-off level is applied to turn each of the switching transistors TR off.

In this case, an electrical insulation state, that is, a disconnection state, may be formed between the data lines DL located in a lower side and the connection lines CL, that is, the first lines CL1 located in an upper side by interposing the switching transistors TR therebetween.

Thus, an electrical disconnection state may be formed between adjacent data lines DL.

Consequently, during the trimming process, even when an electrical short circuit occurs between adjacent first lines CL1 due to foreign materials generated along the trimming line TL, that is, the upper side ES, the data lines DL are not electrically shorted due to the switching transistor TR in an off state to have a disconnection state.

Therefore, it is possible to effectively prevent occurrence of a line dim phenomenon in which adjacent data lines DL are electrically shorted due to the foreign materials.

Meanwhile, similar to the switching transistors TR, the switching signal of a turn-off level is applied to each of the test transistors TRa, and thus the test transistors TRa are turned off.

Thus, the test transistors TRa do not have a substantial effect on the data lines DL.

As described above, the switching transistors TR are formed on a side opposite to the data lines DL by interposing the first input pads IP1 therebetween so that, even when an electrical short circuit occurs due to foreign materials, it is possible to prevent the electrical short circuit between the data lines DL.

Since a structure capable of securing a disconnection state using the switching transistors TR is applied, the first lines CL1 which are portions of the connection lines CL crossing the trimming line TL may be formed of a metal material, for example, the same material as the gate lines and coplanarly formed therewith.

In this regard, as measures for reducing occurrence of foreign materials during the trimming process, it may be considered that the first lines CL1 connected to the electrical characteristic test circuit 400 are formed using semiconductor layers which are used for the transistors formed in the display area AA and the non-display area NA of the display panel 100.

In this regard, since the semiconductor layer has a thickness that is smaller than a thickness of the metal film formed in the display panel 100, occurrence of foreign materials is reduced during the trimming process so that an electrical short circuit due to the foreign materials may be reduced.

However, the semiconductor layer has resistance that is larger than resistance of the metal film. For example, sheet resistance of the semiconductor layer is about 3 kΩ. In the electrical characteristic test, when the detected electrical characteristic signal has a normal amplitude, for example, 150 mV or more, it is determined as being in a normal state, and when the detected electrical characteristic signal is lower than 150 mV, it is determined as being in a defective state. When the semiconductor layer is used, since resistance is high and thus an amplitude of the detected electrical characteristic signal is reduced, it is difficult to detect a defect.

In this regard, in the present embodiment, the first lines CL1 may be formed in the same process as the gate lines which are metal films. Thus, the first line CL1 has a low resistance. For example, sheet resistance of the first line CL1 is about 0.56 kΩ.

Consequently, a decrease in amplitude of the electrical characteristic signal is reduced so that testing power of the electrical characteristic test may be effectively improved.

As described above, according to the embodiments of this disclosure, a switching transistor is formed between an input pad to which a data line is connected and a connection line extending to one side of a substrate, and the switching transistor is turned off in a module state of a display device.

Thus, even when an electrical short circuit occurs between the connection lines due to foreign materials generated during a trimming process, the data lines are not electrically shorted due to the switching transistor being in an off state, and the data lines have a disconnection state.

Therefore, it is possible to effectively prevent a line dim phenomenon from occurring due to an electrical short circuit so that an image quality defect may be reduced.

A display device according to the embodiments of this disclosure may include a substrate in which a display area in which pixels are disposed and a non-display area are defined and in which data lines are formed to extend into the display area and connected to the pixels, a first input pad connected to the data lines in the non-display area, a switching transistor located in the non-display area between the first input pad and one side of the substrate and connected to the first input pad, and a second input pad connected to a gate electrode of the switching transistor through a switching line in the non-display area.

According to the embodiments of this disclosure, a switching signal of a turn-off level may be applied to the second input pad.

According to the embodiments of this disclosure, a connection line connected to the switching transistor and having a first line extending to one side of the substrate may be further included.

According to the embodiments of this disclosure, a first line may be formed of a metal material which forms the gate line connected to a pixel.

According to the embodiments of this disclosure, the connection line may include a second line connecting the switching transistor and the first input pad.

According to the embodiments of this disclosure, a test transistor which is connected to the data line in parallel and of which a gate electrode is connected to the second input pad through a test control line may further be included.

According to the embodiments of this disclosure, the test control line may be connected to the switching line through a branch line which branches off from the test control line.

According to the embodiments of this disclosure, the test control line may extend to one side of the substrate.

According to the embodiments of this disclosure, a test signal line which is connected to the source electrode of the test transistor and extends to one side of the substrate may be further included.

According to the embodiments of this disclosure, a circuit film which includes first and second output pads connected to the first and second input pads and on which a drive integrated circuit (IC) is mounted may be further included.

According to the embodiments of this disclosure, the pixel may include a light emitting diode.

Meanwhile, for convenience of description, although the OLED device has been described as an example, it is obvious to those skilled in the art that the embodiments of this disclosure may be applied to all types of display devices using COF type drive ICs, including LCD devices using liquid crystal panels as display panels.

In accordance with the present disclosure, a switching transistor can be formed between an input pad to which a data line is connected and a connection line extending to one side of a substrate, and the switching transistor can be turned off in a module state of a display device.

Thus, even when an electrical short circuit occurs between the connection lines due to foreign materials generated during a trimming process, the data lines cannot be electrically shorted due to the switching transistor being in an off state, and the data lines can have a disconnection state.

Therefore, it is possible to effectively prevent a line dim phenomenon from occurring due to an electrical short circuit so that an image quality defect can be reduced.

Features, structures, effects, and the like which are described in the examples of this disclosure are included in at least one example of this disclosure and are not necessarily limited to only one example. In addition, the features, structures, effects, and the like described in at least one example of this disclosure can be combined or modified for other examples by those skilled in the art to which the present disclosure pertains. Therefore, contents related to such a combination and modification should be construed as being included in the scope of the present disclosure.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including a display area and a non-display area, the display area including pixels;
   data lines extending into the display area and connected to the pixels;
   first input pads in the non-display area and respectively directly connected to the data lines on a one-to-one basis;
   a plurality of switching transistors in the non-display area respectively directly connected to the first input pads on a one-to-one basis to be between the first input pads and a first side of the substrate such that each first input pad is connected between a respective switching transistor among the plurality of switching transistor and a respective data line;
   a plurality of first connection lines respectively connected to ones of the plurality of switching transistors on a one-to-one basis, each first connection line extending to an edge of the substrate at the first side on a one-to-one basis; and
   a second input pad in the non-display area and connected to a gate electrode of each switching transistor of the plurality of switching transistors through a switching line; and
   a circuit film connected to the first side of the substrate and including first and second output pads, wherein the first output pad is connected to and transmits a data signal for displaying an image to the first input pads, and the second output pad is connected to and transmits a switching signal to the second input pad.

2. The display device of claim 1, wherein a switching signal of a turn-off level is applied to the second input pad.

3. The display device of claim 1, wherein each first connection line is formed of a metal material forming a gate line connected to the pixel.

4. The display device of claim 1, further comprising a plurality of second connection lines respectively connecting ones of the plurality of switching transistors to the first input pads on a one-to-one basis.

5. The display device of claim 1, further comprising a test transistor connected to one of the data lines in parallel,
   wherein a gate electrode of the test transistor is connected to the second input pad through a test control line.

6. The display device of claim 5, wherein the test control line is connected to the switching line through a branch line being branched from the test control line.

7. The display device of claim 5, wherein the test control line extends to the first side of the substrate.

8. The display device of claim 5, further comprising a test signal line connected to a source electrode of the test transistor and extending to the first side of the substrate.

9. The display device of claim 1, a drive integrated circuit is mounted on the circuit film.

10. The display device of claim 1, wherein the pixels each include a respective light emitting diode.

11. The display device of claim 1, wherein a first end of each first input pad is connected to an end of the respective data line, and a second end of each first input pad opposite to the respective first end is connected to a drain electrode of a respective switching transistor among the plurality of switching transistors.

12. A display device, comprising:
a display panel including:
 a display area for displaying an image, the display area including pixels; and
 a non-display area located at an outer side of the display panel and surrounding the display area, the non-display area including data lines extending into the display area and connected to the pixels, first input pads respectively directly connected to the data lines on a one-to-one basis, a plurality of switching transistors respectively directly connected to the first input pads on a one-to-one basis to be between the first input pads and a first side of the display panel such that each first input pad is connected between a respective switching transistor among the plurality of switching transistors and a respective data line, a plurality of first connection lines respectively connected to ones of the plurality of switching transistors on a one-to-one basis, each first connection line extending to an edge of the substrate at the first side on a one-to-one basis, and a second input pad connected to a gate electrode of each switching transistor of the plurality of switching transistors through a switching line; and
a circuit film connected to the first side of the display panel and including first and second output pads, wherein the first output pad is connected to and transmits a data signal for displaying an image to the first input pads, and the second output pad is connected to and transmits a switching signal to the second input pad.

13. The display device of claim 12, further comprising a test transistor connected to one of the data lines in parallel, wherein a gate electrode of the test transistor is connected to the second input pad through a test control line.

14. The display device of claim 12, wherein a first end of each first input pad is connected to an end of the respective data line, and a second end of each first input pad opposite to the respective first end is connected to a drain electrode of a respective switching transistor among the plurality of switching transistors.

15. The display device of claim 12, wherein the pixels each include a respective light emitting diode.

* * * * *